United States Patent
Saito (10) Patent No.: US 10,123,453 B2
(45) Date of Patent: Nov. 6, 2018

(54) ELECTRONIC APPARATUS COOLING SYSTEM

(71) Applicant: EXASCALER INC., Tokyo (JP)

(72) Inventor: Motoaki Saito, Tokyo (JP)

(73) Assignee: EXASCALER INC., Tokyo (JP)

( * ) Notice: Subject to any disclaimer, the term of this patent is extended or adjusted under 35 U.S.C. 154(b) by 0 days.

(21) Appl. No.: 15/533,348

(22) PCT Filed: Dec. 5, 2014

(86) PCT No.: PCT/JP2014/082342
§ 371 (c)(1),
(2) Date: Jun. 5, 2017

(87) PCT Pub. No.: WO2016/088280
PCT Pub. Date: Jun. 9, 2016

(65) Prior Publication Data
US 2017/0354061 A1  Dec. 7, 2017

(51) Int. Cl.
*H05K 7/20* (2006.01)
*H01L 23/473* (2006.01)
(Continued)

(52) U.S. Cl.
CPC .......... *H05K 7/20236* (2013.01); *F25D 9/00* (2013.01); *G06F 1/20* (2013.01); *G06F 1/206* (2013.01);
(Continued)

(58) Field of Classification Search
CPC ....... H05K 7/20236; H05K 7/20627–7/20645; H05K 7/20763–7/20781
See application file for complete search history.

(56) References Cited

U.S. PATENT DOCUMENTS

| | | |
|---|---|---|
| 4,590,538 A | 5/1986 | Cray, Jr. |
| 5,329,418 A | 7/1994 | Tanabe |
| | (Continued) | |

FOREIGN PATENT DOCUMENTS

| | | |
|---|---|---|
| DE | 60123179 T2 | 9/2007 |
| JP | S56-19046 U | 2/1981 |
| | (Continued) | |

OTHER PUBLICATIONS

Extended European Search Report for related EP App No. 14907366.0 dated Jun. 7, 2018, 8 pgs.
(Continued)

*Primary Examiner* — Robert J Hoffberg
(74) *Attorney, Agent, or Firm* — Procopio, Cory, Hargreaves & Savitch LLP (57) ABSTRACT

Provided is a cooling system capable of improving the cooling performances of a plurality of electronic apparatuses, of making stabilization by eliminating the variance in the cooling performances and of being improved in the handling and maintainability of the electronic apparatuses. A plurality of inner partitioning walls are provided in a cooling tank having an open space defined by a bottom wall and side walls to divide the open space, and a plurality of arrayed storage sections are defined. An electronic apparatus is stored in each of the storage sections. Each of the storage sections is formed with an inflow opening and an outflow opening for the cooling liquid. The inflow opening is formed at a bottom portion or a side surface of each storage section, and the outflow opening is formed in the vicinity of the liquid level of the cooling liquid flowing through each storage section.

13 Claims, 7 Drawing Sheets

(51) Int. Cl.
*F25D 9/00* (2006.01)
*G06F 1/20* (2006.01)
*H01L 23/44* (2006.01)
*F24T 10/10* (2018.01)

(52) U.S. Cl.
CPC ............ *H01L 23/44* (2013.01); *H01L 23/473* (2013.01); *H05K 7/20* (2013.01); *H05K 7/20636* (2013.01); *F24T 10/10* (2018.05); *F25D 9/005* (2013.01); *H01L 2924/0002* (2013.01); *Y02E 10/12* (2013.01)

(56) References Cited

U.S. PATENT DOCUMENTS

| | | | |
|---|---|---|---|
| 5,943,211 | A | 8/1999 | Havey et al. |
| 9,756,766 | B2 * | 9/2017 | Best .................. H05K 7/20763 |
| 2007/0070601 | A1 | 3/2007 | Vos et al. |
| 2007/0139888 | A1 | 6/2007 | Hamman et al. |
| 2016/0234970 | A1 * | 8/2016 | Shelnutt ............. H05K 7/20809 |
| 2018/0020571 | A1 * | 1/2018 | Saito ......................... G06F 1/20 |
| 2018/0246550 | A1 * | 8/2018 | Inaba ...................... G06F 1/206 |

FOREIGN PATENT DOCUMENTS

| | | |
|---|---|---|
| JP | S60-81847 A | 5/1985 |
| JP | S60-81849 A | 5/1985 |
| JP | H04129255 A | 4/1992 |
| JP | H04207098 A | 7/1992 |
| JP | 2002-505033 A | 2/2002 |
| JP | 2012161242 A | 8/2012 |
| JP | 2012-527109 A | 11/2012 |
| JP | 5-145208 B2 | 2/2013 |
| JP | 2013-187251 A | 9/2013 |
| JP | 2013187251 A | 9/2013 |

OTHER PUBLICATIONS

Communication Pursuant to Rules 70(2) and 70a(2) EPC for related EP App No. 14907366.0 dated Jun. 26, 2018, 1 pg.
International Search Report and Written Opinion for PCT App No. PCT/JP2014/082342 dated Jan. 6, 2015, 9 pgs.
Decision to Grant a Patent for JP App No. 2016-507716 dated Apr. 13, 2016, 6 pgs.
International Preliminary Report on Patentability for PCT App No. PCT/JP2014/082342 dated Jun. 15, 2017, 6 pgs.

* cited by examiner

ELECTRONIC APPARATUS COOLING SYSTEM

CROSS-REFERENCE TO RELATED APPLICATIONS

This application is a U.S. National Stage entry of PCT Application No. PCT/JP2014/082342, filed on Dec. 5, 2014, the contents of which are incorporated herein by reference.

TECHNICAL FIELD

The present invention relates to an electronic apparatus cooling system and particularly, to an electronic apparatus cooling system for efficiently cooling electronic apparatuses such as super computers, data centers and the like that require ultra-high performance operations and stable operations and that have large amounts of heat generated from themselves.

BACKGROUND ART

One of the biggest problems that determine the limitation in performance of supercomputers in recent years is power consumption, and the importance of researches relating to the power-saving capability of supercomputers has already been recognized widely. That is, the speed performance per consumed power (Flops/W) has become one barometer for evaluating the supercomputers. Further, in data centers, it is understood that 45% or so of the power consumption by the whole data centers are consumed for cooling, and therefore, a demand for reduction of the power consumption through improvements in cooling efficiency has become strong.

Heretofore, an air-cooling type and a liquid-cooling type have been in use for cooling supercomputers and data centers. The liquid-cooling type is generally recognized to be high in cooling efficiency because of using a liquid that is remarkably superior to air in heat transfer performance. For example, the "TSUBAME-KFC" built by Tokyo Institute of Technology achieved 4.50 G Flops/W by a liquid immersion cooling system using a synthetic oil and acquired the first place in "Supercomputer Green 500 List" announced on November, 2013 and June, 2014. However, because the synthetic oil being high in viscosity is used as the cooling liquid, it is difficult to completely remove, from electronic apparatuses taken out from oil-immersed racks, the oil adhered thereto, and this gives rise to a problem that the maintenance (specifically, adjustment, inspection, repair, replacement and expansion, for example; the same applies hereafter) of the electronic apparatuses is extremely difficult. Furthermore, the occurrence of a problem has been reported that causes a difficulty to arise in practical use because, for example, the synthetic oil in use leaks by corroding a gasket and the like constituting the cooling system in a short period of time.

On the other hand, there has been proposed a liquid immersion cooling system that uses not the synthetic oil causing the aforementioned problems but a cooling liquid of the fluorocarbon-base. Specifically, it is an example that uses a cooling liquid of the fluorocarbon-base (a hydrofluoroether (HFE) compound known as "Novec (trademark of 3M Company; the same applies hereafter) 7100", "Novec 7200" and "Novec 7300", brand names of 3M Company) (Patent Literature 1 and Patent Literature 2, for example).

CITATION LIST

Patent Literature

Patent Literature 1: Japanese Patent Application Laid-Open No. 2013-187251
Patent Literature 2: Japanese Unexamined Patent Application Publication (Translation of PCT Application) No. 2012-527109

SUMMARY OF INVENTION

Technical Problem

In the cooling system disclosed in Patent Literature 1, a plurality of containers storing servers are stored in racks installed in the data center, a plurality of servers are stored in each of the containers, and there is connected a refrigerant flow mechanism that constitutes the flow of liquid refrigerant from an inlet to an outlet in each container. Thus, within one container, the temperature of the liquid refrigerant becomes high as the same is close to the outlet apart relative to the inlet, and further, because the electronic apparatuses stored within a container of a large volume in a high density impede the flow of the liquid refrigerant, warmed liquid refrigerant is apt to stay at around the center of the container. This generates a temperature distribution within the container and hence, gives rise to a problem that in dependence on the storage positions of servers, a large difference in cooling performances arises between the server themselves or between important semiconductor parts and electronic components within each server.

On the other hand, the cooling system disclosed in Patent Literature 2 takes the configuration of a sealed module containing one or more heating electronic apparatuses. Thus, because a mechanism for making cooling fluid flow to pass through individual sealed modules becomes complicated as a whole and because it is unable to take out the whole of electronic apparatuses easily from the sealed module, there arises a problem in that the maintainability of the electronic apparatuses are inferior.

In electronic apparatuses used in recent supercomputers, data centers and the like, a plurality of objects to be cooled such as a GPU (Graphics Processing Unit), a high speed memory, a chip set, a network unit, a bus switching unit, an SSD (Solid State Drive), an ac-dc converter, a dc-dc voltage converter and the like are included in addition to a CPU (Central Processing Unit), and it is often the case that any one or a plurality of these electronic components or a combination of these electronic components are mounted on one or several boards (for example, mounting in combination one mother board and a plurality of general-purpose boards with a CPU mounted). Thus, where servers of the size for 19 inch-racks which are conventional in data centers and the like are stored in a liquid immersion rack and are subjected to liquid immersion cooling, a hoist crane or the like is used in order to insert into or take out from a liquid immersed rack a massive and heavy server having a dimension of the degree being 70 to 90 centimeters high and 45 centimeter wide. Accordingly, in liquid immersion cooling systems in the prior art, there arises a problem that an inconvenience occurs in handling the electronic apparatus being large in size and being heavy and that much effort is required for the setting and maintenance therefor.

As aforementioned, the liquid immersion cooling system in the prior art involves a problem that the temperature distribution is generated with the cooling liquid in a cooling tank, thereby causing large differences to arise in cooling performances of the electronic apparatuses in dependence on the storage locations of the electronic apparatuses. Further, another problem arises in that the mechanism for making the cooling liquid flow through the sealed module becomes complicated as a whole, thereby being inferior in the maintainability of the electronic apparatuses. In addition, a further problem arises in that inconvenience occurs in handling the electronic apparatuses being larger in size and being heavy and hence that much effort is required for the installation and maintenance of the electronic apparatuses.

Accordingly, an object of the present invention is to provide a cooling system capable of solving the problems of the foregoing prior art, of improving the cooling performances of a plurality of electronic apparatuses and of being stabilized through the elimination of variance in cooling performance. Further, another object of the present invention is to provide a cooling system being improved in handling capability and maintainability of a plurality of electronic apparatuses in immersion cooling.

Solution to Problem

In order to solve the foregoing problems, according to the present invention, there is provided a cooling system for directly cooling a plurality of electronic apparatuses through immersion into cooling liquid, the cooling system comprising a cooling tank having an open space defined by a bottom wall and side walls, a plurality of arrayed storage sections defined by a plurality of inner partitioning walls provided within the cooling tank to divide the open space, the storage sections being for storing at least one electronic apparatus in each storage section, and an inflow opening and an outflow opening for the cooling liquid that are formed at each of the plurality of storage sections, wherein the inflow opening is formed at a bottom portion or a side surface of each storage section and wherein the outflow opening is formed in the vicinity of the liquid level of the cooling liquid flowing through each storage section.

In a preferred embodiment of the cooling system according to the present invention, the outflow opening and/or the inflow opening may be configured to be formed at a position where the plurality of inner partitioning walls defining each storage section intersect with one another, or in the vicinity of the position.

Further, in another preferred embodiment of the cooling system according to the present invention, an outflow pipe may be further provided piercing through the bottom wall and extending to the vicinity of the liquid level, wherein the outflow opening may be formed at one end of the outflow pipe.

Furthermore, in another preferred embodiment of the cooling system according to the present invention, one or more small holes may be formed in the longitudinal direction of the outflow pipe.

Further, in another preferred embodiment of the cooling system according to the present invention, an inflow pipe may be further provided piercing through the bottom wall and extending to the vicinity of the liquid level, wherein the inflow pipe may be provided with a plurality of nozzles in the longitudinal direction of the inflow pipe and wherein the inflow opening may be formed on each of the plurality of nozzles.

Furthermore, in another preferred embodiment of the cooling system according to the present invention, an inflow pipe and an outflow pipe may be further provided that pierce through the bottom wall and that extend to the vicinity of the liquid level, wherein the inflow pipe may be provided with a plurality of nozzles in the longitudinal direction of the inflow pipe, wherein the inflow opening may be provided on each of the plurality of nozzles, wherein the outflow opening may be formed at an upper end of the outflow pipe, and wherein the inflow pipe and the outflow pipe may be alternately arranged at positions where the plurality of inner partitioning walls defining each storage section intersect with one another, or in the vicinity of the positions.

Further, in another preferred embodiment of the cooling system according to the present invention, an inflow pipe and an output pipe may be further provided that pierce through the bottom wall and that extend to the vicinity of the liquid level, wherein the inflow pipe may be provided with a plurality of nozzles in the longitudinal direction of the inflow pipe, wherein the inflow opening may be formed on each of the plurality of nozzles, wherein the outflow opening may be formed at an upper end of the outflow pipe, and wherein the inflow pipe and the outflow pipe may constitute a double pipe containing the outflow pipe in the inflow pipe.

Furthermore, in another preferred embodiment of the cooling system according to the present invention, the double pipe may be arranged at a position where the plurality of inner partitioning walls defining each storage section intersect with one another, or in the vicinity of the position.

Further, in another preferred embodiment of the cooling system according to the present invention, the cooling liquid may be configured to contain perfluoride as a main component.

Furthermore, in another preferred embodiment of the cooling system according to the present invention, the cooling tank has an inlet for distributing the cooling liquid toward the inflow openings of respective storage sections and an outlet for collecting the cooling liquids passing through the outflow openings of the respective storage sections, wherein the outlet and the inlet may be connected through a flow passage existing outside the cooling tank, and wherein at least one pump for moving the cooling liquid and a heat exchanger for cooling the cooling liquid may be provided in the flow passage.

Further, in another preferred embodiment of the cooling system according to the present invention, there may be further provided with a mechanism which, in response to an input signal depending on the temperature variation in each storage section, regulates the flow rate of the cooling liquid passing through the inflow opening of each storage section or the flow rate of the cooling liquid passing through each nozzle provided on the inflow pipe.

Furthermore, in another preferred embodiment of the cooling system according to the present invention, a first temperature sensor for liquid may be provided within each storage section, and there may be further provided a mechanism which discontinues the operation of the electronic apparatus stored in the storage section or interrupts the power supply to the electronic apparatus when a predetermined temperature or higher is detected by the first temperature sensor.

Further, in another preferred embodiment of the cooling system according to the present invention, a second temperature sensor may be provided in the electronic apparatus stored in each storage section, or in a surrounding area of the electronic apparatus stored in each storage section, and there may be further provided a mechanism which discontinues the operation of the electronic apparatus or interrupts the power supply to the electronic apparatus when a predetermined temperature or higher is detected by the second temperature sensor.

Advantageous Effects of Invention

According to the cooling system in the present invention, by the provision of the plurality of inner partitioning walls in the cooling tank which has the open space defined by the bottom wall and the side walls, the open space is divided and the plurality of arrayed storage sections are formed. Then, at least one electronic apparatus is stored in each storage section. Then, each of the plurality of storage sections is formed with the inflow opening and the outflow opening for the cooling liquid, and the inflow opening is formed at the bottom portion or a side surface of each storage section, while the outflow opening is formed in the vicinity of the liquid level of the cooling liquid flowing through each storage section. Therefore, an electronic apparatus of the width (for example, about ½, ⅓ or ¼) being smaller than that in the prior art is stored in the storage section of the volume being about ¼ or the volume being smaller than about ¼ of the volume of the open space of the cooling tank (for example, about ⅑ (in the case of the division of 3 in length by 3 in width), ¹⁄₁₂ (in the case of the division of 3 in length by 4 in width), or ¹⁄₁₆ (in the case of the division of 4 in length by 4 in width) of the open space volume), and the cooling liquid is made to flow individually, so that it becomes possible to cool the plurality of electronic apparatuses individually and efficiently. In other words, in the present invention, since the warmed cooling liquid can be made to flow out also from a center portion of the cooling tank, it can be avoided that the cooling liquid stays at around the center of the cooling tank as is the case in the prior art wherein warmed cooling liquid is made to flow out from a side surface of a cooling tank and hence that the difference in cooling performance arises in dependence on storage positions of the electronic apparatuses within the cooling tank. Accordingly, the cooling performances of the plurality of electronic apparatuses can be improved and can be stabilized by being prevented from being varied. Further, since the electronic apparatuses stored in the storage sections can be reduced in dimension, it is possible to improve the handling and maintainability of the electronic apparatuses. Incidentally, the cooling tank with the "open space" in the present description also encompasses a cooling tank having a simple closed structure of the degree that does not spoil the maintainability of the electronic apparatuses. For example, the structure in which a top board is detachably attached to an opening portion of a cooling tank through a gasket is considered to be the simple closed structure.

The foregoing object and advantages and other objects and advantages of the present invention will be further clarified by the description of the following embodiments. However, the embodiments described hereafter are for exemplification purpose and do intend to limit the present invention to the embodiments.

DESCRIPTION OF EMBODIMENTS

Hereinafter, preferred embodiments of a cooling system according to the present invention will be described in detail with reference to the drawings. In the description of the embodiments, there will be described high-density cooling systems of the configuration that stores 16 units in total as electronic apparatuses in respective storage sections of a cooling tank, each unit having an electronic apparatus (1 unit) of the structure in which three processor boards each mounting a processor composed of a CPU or a GPU are arranged on one surface. Incidentally, this is for the purpose of exemplification. The number and the kind of the processors (CPU or GPU) per board are discretionary, the unit number of the electronic apparatuses in the high-density cooling systems is also discretionary, and such number or kind does not limit the configuration of the electronic apparatuses in the present invention.

Referring to FIG. 1 to FIG. 4, a cooling system 10 according to one embodiment of the present invention has a cooling tank 12, and an open space 10a is defined by a bottom wall 12a and side walls 12b of the cooling tank 12. The open space 10a is divided equally into sixteen by the provision of inner partitioning walls 13a, 13b, 13c, 13d, 13e in a length direction and inner partitioning walls 14a, 14b, 14c, 14d, 14e in a width direction in the cooling tank 12, whereby sixteen arrayed storage sections 15aa, 15ab, 15ac, 15ad, 15ba, 15bb, 15bc, 15bd, 15ca, 15cb, 15cc, 15cd, 15da, 15db, 15dc, 15dd (hereafter, occasionally referred to as "storage sections 15aa to 15dd" collectively) are defined. Then, at least one electronic apparatus 100 is stored in each storage section. Within the open space 10a of the cooling tank 12, cooling liquid 11 is contained to a liquid level 19. The storage sections 15aa, 15ab, 15ac, 15ad, 15ba, 15bb, 15bc, 15bd, 15ca, 15cb, 15cc, 15cd, 15da, 15db, 15dc, 15dd are formed at bottom portions with inflow openings 16aa, 16ab, 16ac, 16ad, 16ba, 16bb, 16bc, 16bd, 16ca, 16cb, 16cc, 16cd, 16da, 16db, 16dc, 16dd (hereafter, occasionally referred to as "inflow openings 16aa to 16dd" collectively), respectively.

Further, in the vicinity of the liquid level 19 of the cooling liquid 11 flowing through the storage sections 15aa to 15dd, there are formed outflow openings 17aa, 17ab, 17ac, 17ad, 17ae, 17ba, 17bb, 17bc, 17bd, 17be, 17ca, 17cb, 17cc, 17cd, 17ce, 17da, 17db, 17dc, 17dd, 17de, 17ea, 17eb, 17ec, 17ed, 17ee (hereafter, occasionally referred to as "outflow openings 17aa to 17ee" collectively).

In the illustrated example, the outflow openings are formed at positions where the plurality of inner partitioning walls defining respective storage sections intersect with one another, or in vicinity of such positions. For example, referring to FIG. 1, the storage section 15*aa* is defined by the inner partitioning wall 13*a*, 13*b* in the length direction and the inner partitioning wall 14*a*, 14*b* in the width direction, and the outflow openings 17*aa*, 17*ba*, 17*ab*, 17*bb* are formed to be located respectively at an intersection point of the inner partitioning wall 13*a* and the inner partitioning wall 14*a*, an intersection point of the inner partitioning wall 13*a* and the inner partitioning wall 14*b*, an intersection point of the inner partitioning wall 13*b* and the inner partitioning wall 14*a*, and an intersection point of the inner partitioning wall 13*b* and the inner partitioning wall 14*b*. Likewise, referring to FIG. 2, the storage section 15*bb* is defined by the inner partitioning walls 13*b*, 13*c* in the length direction and the inner partitioning walls 14*b*, 14*c* in the width direction, and the outflow openings 17*bb*, 17*cb*, 17*bc*, 17*cc* are formed to be located respectively at an intersection point of the inner partitioning wall 13*b* and the inner partitioning wall 14*b*, an intersection point of the inner partitioning wall 13*b* and the inner partitioning wall 14*c*, an intersection point of the inner partitioning wall 13*c* and the inner partitioning wall 14*b*, and an intersection point of the inner partitioning wall 13*c* and the inner partitioning wall 14*c*.

In the present embodiment, the outflow openings are formed at respective one ends of outflow pipes 170 piercing through the bottom wall 12*a* of the cooling tank 12 and extending to the vicinity of the liquid level 19. For example, referring to FIG. 2, with respect to the storage section 15*bb*, the outflow openings 17*bb*, 17*cb*, 17*bc*, 17*cc* are formed at respective one ends of the outflow pipes 170. The outflow pipes are defined by the inner partitioning walls 13*b*, 13*c* in the length direction and the inner partitioning walls 14*b*, 14*c* in the width direction and are located respectively at an intersection point of the inner partitioning wall 13*b* and the inner partitioning wall 14*b*, an intersection point of the inner partitioning wall 13*b* and the inner partitioning wall 14*c*, an intersection point of the inner partitioning wall 13*c* and the inner partitioning wall 14*b*, and an intersection point of the inner partitioning wall 13*c* and the inner partitioning wall 14*c*. Incidentally, respective other ends of the outflow pipes are formed with bottom openings 18*aa*, 18*ab*, 18*ac*, 18*ad*, 18*ae*, 18*ba*, 18*bb*, 18*bc*, 18*bd*, 18*be*, 18*ca*, 18*cb*, 18*cc*, 18*cd*, 18*ce*, 18*da*, 18*db*, 18*dc*, 18*dd*, 18*de*, 18*ea*, 18*eb*, 18*ec*, 18*ed*, 18*ee* (hereafter, occasionally referred to as "bottom openings 18*aa* to 18*ee*" collectively), respectively.

Where the outflow openings are defined at the positions where the plurality of inner partitioning walls defining the respective storage sections intersect with one another, an advantage is obtained in that the outflow openings provided for the respective storage sections can be secured to be distributed to four corners of each storage section. For example, at the storage section 15*bb*, the outflow pipes arranged at the four corners of the section define the outflow openings 17*bb*, 17*bc*, 17*cb* and 17*cc*. Where the outflow openings are defined like this, one outflow opening can become an outflow opening common to the plurality of storage sections. For example, the outflow opening 17*bb* is a part of the outflow openings for the storage section 15*aa* and at the same time, is also a part of the outflow openings for the storage sections 15*ab*, 15*ba* and 15*bb*. The same applies also to the outflow openings 17*bc*, 17*cb* and 17*cc*. However, the positions where the outflow pipes are provided for each storage section and the number of the outflow pipes are discretionary, and one or plural outflow pipes may, of course, be provided in the vicinity of the positions where the plurality of inner partitioning walls defining each storage section intersect with one another. Further, the outflow pipes are not required to be integrated with the inner partitioning walls and may be pipes arranged apart from the inner partitioning walls.

Figure 1:
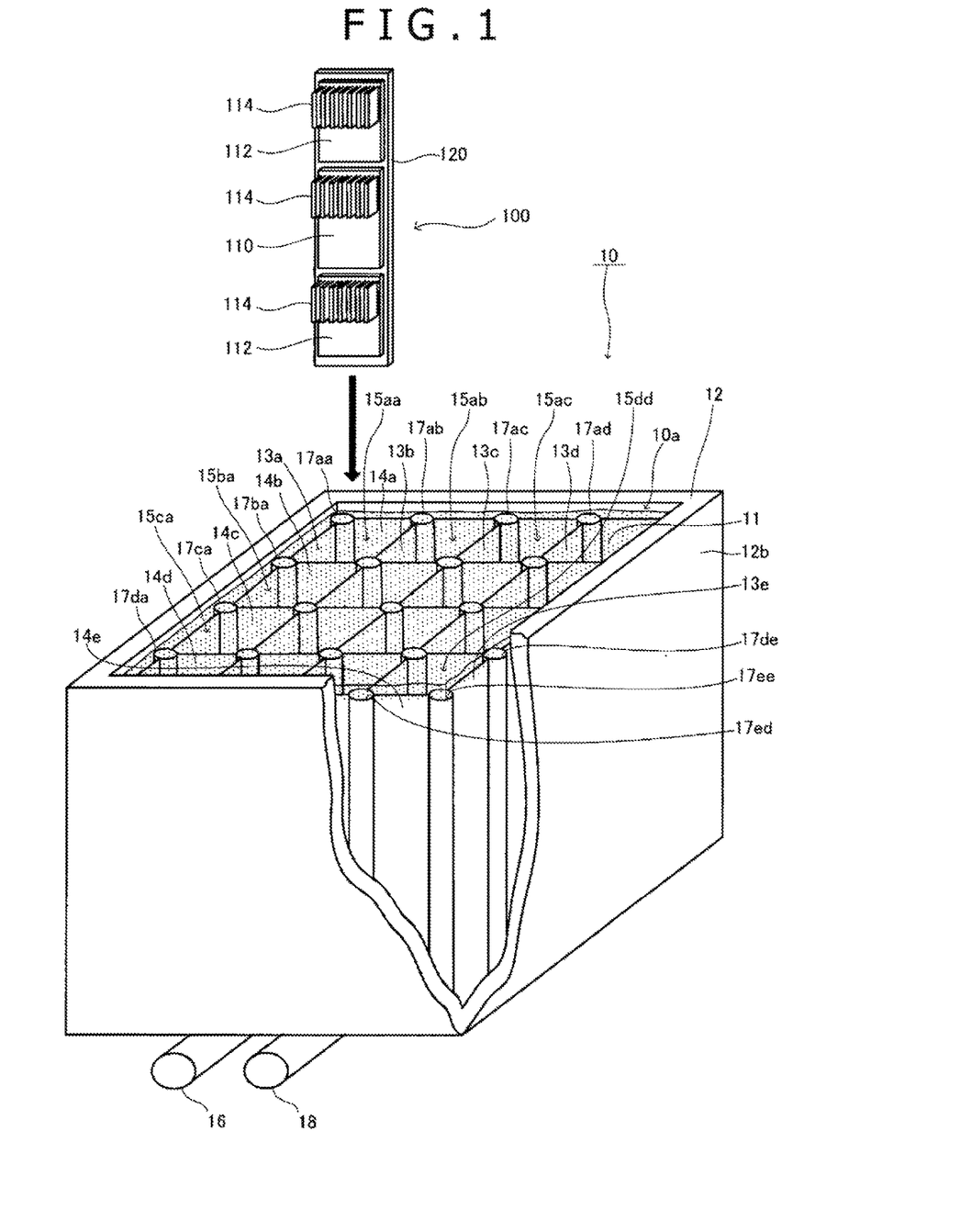
FIG. 1 is a perspective view, inclusive of a partial section, showing an overall structure of a cooling system in one embodiment according to the present invention.
Figure 2:
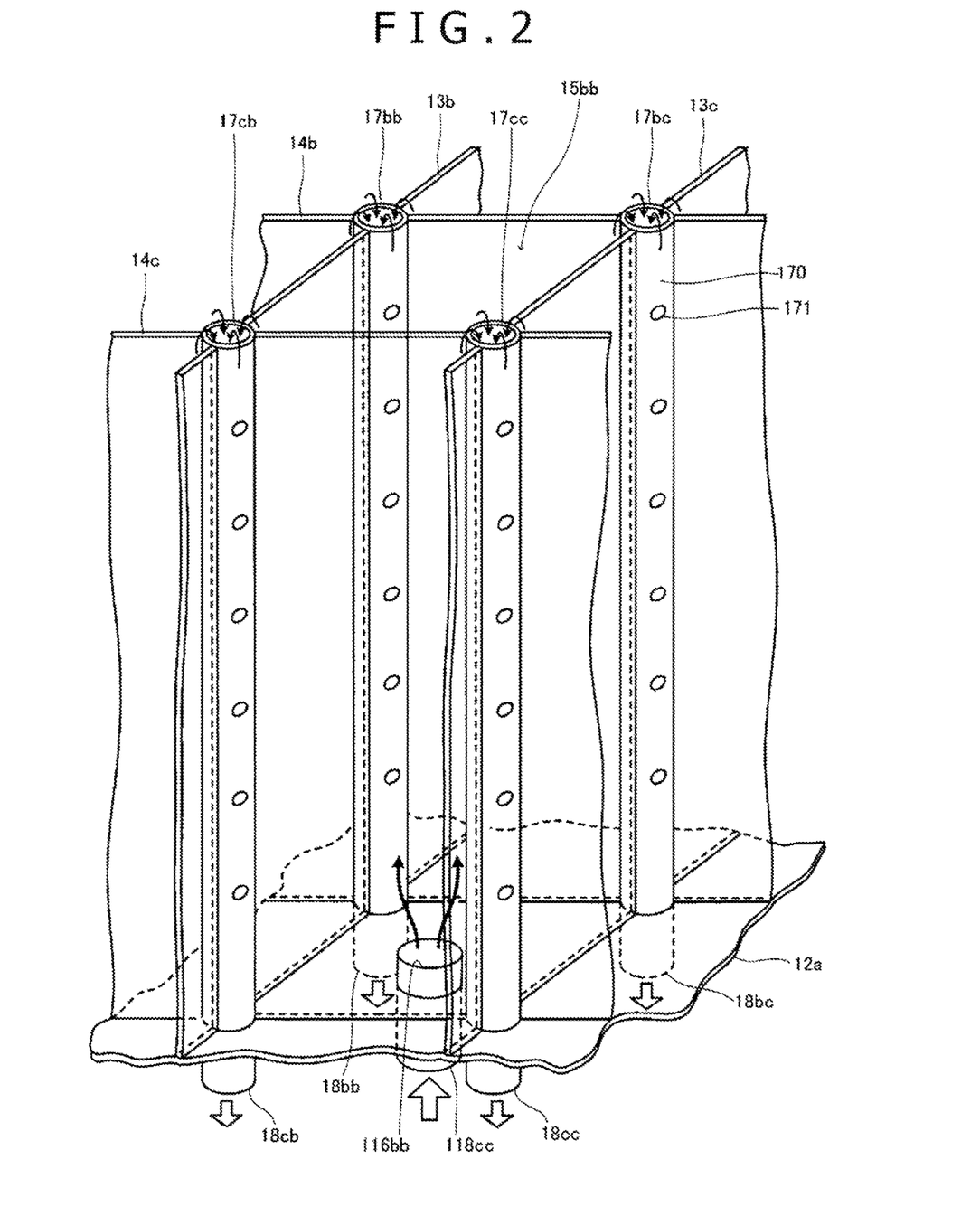
FIG. 2 is a perspective view showing the structure of an important portion of the cooling system in one embodiment according to the present invention.
Figure 3:
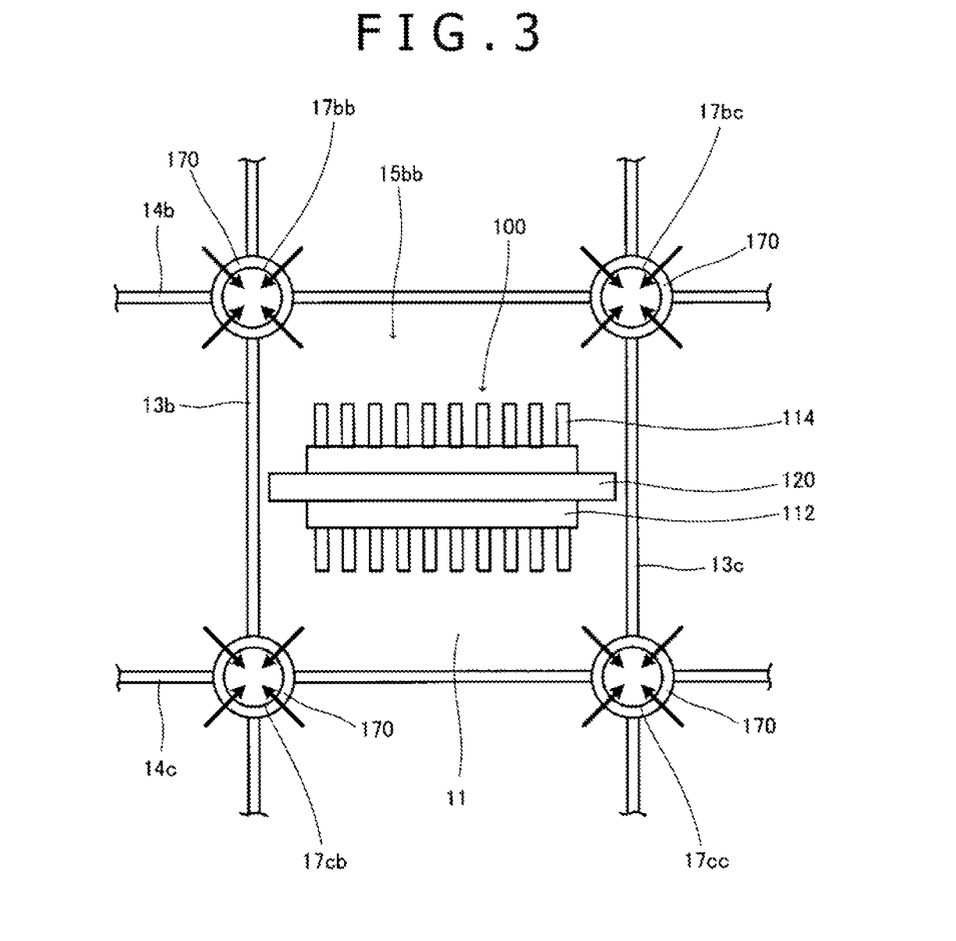
FIG. 3 is a plan view showing the structure of the important portion of the cooling system in one embodiment according to the present invention.
Figure 4:
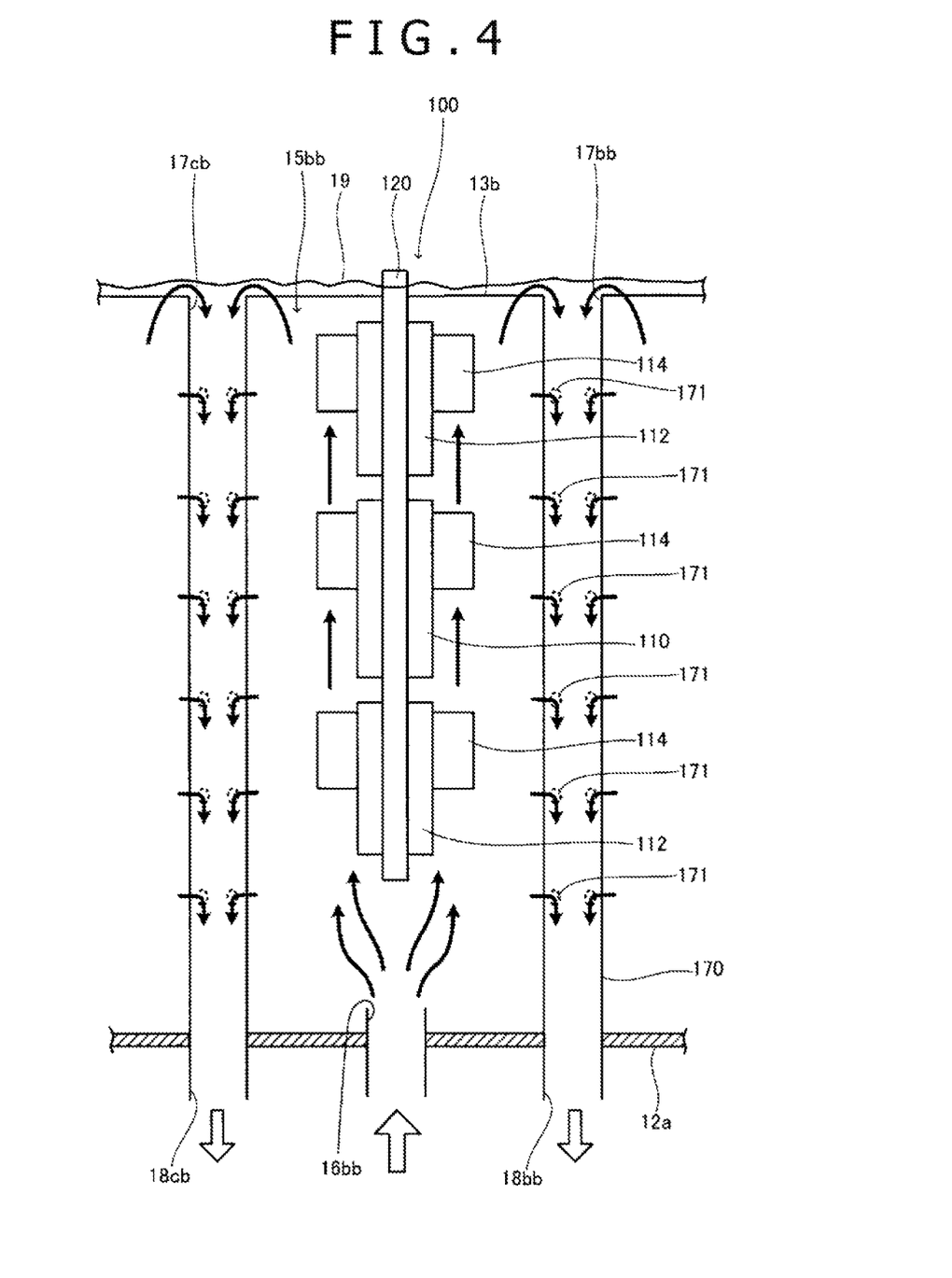
FIG. 4 is a longitudinal sectional view showing the structure of the important portion of the cooling system in one embodiment according to the present invention.

Further, as shown in FIG. 2 and FIG. 4, each outflow pipe 170 may be formed with one or more small holes 171 in the longitudinal direction of the outflow pipe 170. These small holes 171 accelerate the flow of the cooling liquid remaining in the midway of the storage section in the depth direction, as described later. On the other hand, each of the inflow openings 16*aa* to 16*dd* is not required to be a cylindrical opening, as illustrated. For example, a header with a plurality of nozzles may be connected to one end of a cylinder to define the inflow opening by the plurality of nozzles.

In each of the storage sections 15*aa* to 15*dd*, an electronic apparatus 100 mounting three boards in total on each of one surface and the other surface of a board 120 is stored and immersed in the cooling liquid 11, the three boards being composed of one piece of a processor board 110 mounting a CPU and two pieces of processor boards 112 each mounting a GPU. The processor boards 110, 112 include radiation members (radiation fins) 114 thermally connected to the processors. Although on the processor boards 110, 112 and the board 120 for the electronic apparatus 100, peripheral electronic components are mounted as a matter of course besides the processors, these electronic components are omitted from illustration.

In the cooling tank 12, the cooling liquid 11 of the amount sufficient to immerse the whole of the electronic device 100 is contained up to the liquid level 19. As the cooling liquid 11, there can preferably be used a fluorine-based inert liquid comprising perfluoride (a perfluorocarbon compound) and known as "Fluorinert (trademark of 3M Company; the same applies hereafter) FC-72" (boiling point: 56° C.), "Fluorinert FC-770" (boiling point: 95° C.), "Fluorinert FC-3283" (boiling point: 128° C.), "Fluorinert FC-40" (boiling point: 155° C.) or "Fluorinert FC-43" (boiling point: 174° C.), the brand names of 3M Company. However, the cooling liquid 11 is not limited to these. Incidentally, Fluorinert FC-40 and Fluorinert FC-43 are higher in boiling point than 150° C. and very difficult to evaporate and therefore, are advantageous because the height of the liquid level 19 can be maintained for a long period of time where ether of them is used as cooling liquid.

Paying attention to the point that perfluoride possesses excellent properties such as ozone depletion potential being zero and the like because of being a compound which is high in electric insulation and in heat transmission capability, is inert and high in thermal and chemical stabilities, is incombustible and does not include oxygen, the present inventor completed an invention of a cooling system in which a cooling liquid including such perfluoride as a main component is used as a refrigerant for immerse cooling of high-density electronic apparatuses, and already filed a patent application (Japanese Patent Application NO. 2014-170616). As disclosed in this preceding application, particularly, Fluorinert FC-43 or Fluorinert FC-40, when used as a cooling liquid, can efficiently cool a plurality of electronic apparatuses set in a high density within a cooling tank of a small volume while greatly reducing the loss attributed to evaporation of the cooling liquid 11 from the cooling tank having the open space, and therefore, is very advantageous. However, this does not particularly intend to impose restrictions on choosing a cooling liquid of another kind.

The cooling tank 12 is provided with an inlet 16 for distributing the cooling liquid 11 through a distribution pipe (not shown) toward the inflow openings 16aa to 16dd provided at the respective storage sections 15aa to 15dd and an outlet 18 for collecting through a collecting pipe (not shown) the cooling liquids passing through the outflow openings 17aa to 17ee of the respective storage sections 15aa to 15dd.

Figure 5:
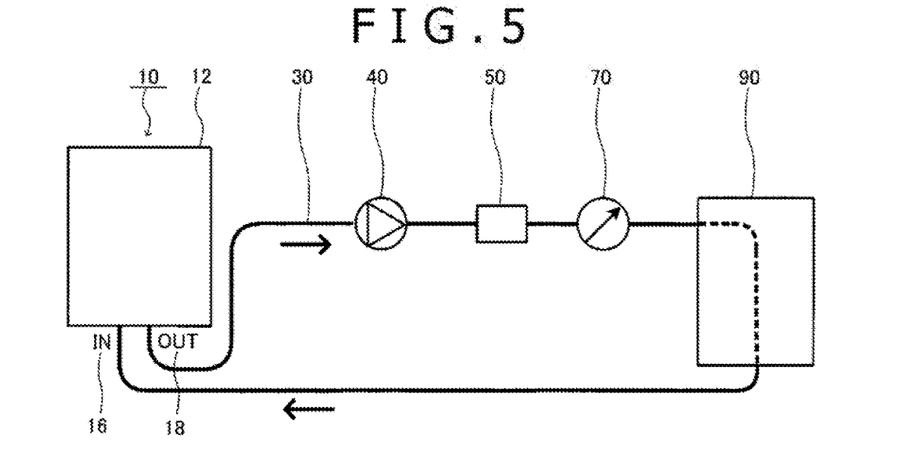
FIG. 5 is a schematic view of the cooling system provided with a drive system and a cooling system in a flow passage connecting an outlet and an inlet of a cooling tank.

Referring to FIG. 5, in order that the cooling liquid cooled to a predetermined temperature continuously goes through the interiors of the respective storage sections 15aa to 15dd whereby the electronic apparatuses 100 stored in the respective storage sections 15aa to 15dd can be kept at a predetermined temperature or lower during the operations, it is preferable to configure a flow passage 30 that by a heat exchanger, cools the warmed cooling liquid 11 coming out of the outlet 18 of the cooling tank 12 to return the cooled cooling liquid to the inlet 16 of the cooling tank 12. As illustrated, the outlet 18 and the inlet 16 of the cooling tank 12 are connected by the flow passage 30, and the flow passage 30 is provided therein with a pump 40 for moving the cooling liquid 11 and a heat exchanger 90 for cooling the cooling liquid 11. Incidentally, the flow passage 30 is also provided therein a flow regulating valve 50 and a flowmeter 70 for regulating the flow rate of the cooling liquid 11 flowing through the flow passage 30.

It is preferable that the pump 40 possesses a performance capable of moving a liquid being relatively large in kinetic viscosity (exceeding 3 cSt in kinetic viscosity at the room temperature of 25° C.). This is because where for example, Fluorinert FC-43 or FC-40 is used as the cooling liquid 11, the kinetic viscosity of FC-43 is the degree of 2.5 to 2.8 cSt and the kinetic viscosity of FC-40 is the degree of 1.8 to 2.2 cSt. The flow regulating valve 50 may be one operated manually or may be one with a regulating mechanism that keeps the flow rate fixed based on a measured value of the flowmeter 70. In addition, the heat exchanger 90 may be chosen from various heat exchangers (radiators or chillers) and refrigerators of the circulation type.

Next, the operation of the cooling system 10 will be described. The cooling liquid 11 entering at the inlet 16 is distributed through a distribution pipe not shown toward the inflow openings 16aa to 16dd formed at the bottom portions of the storage sections 15aa to 15dd. The cooling liquid 11 is forced upward from the inflow openings 16aa to 16dd and directly cools the CPU, the GPU and the peripheral electronic components (not shown) mounted on the three processor boards 112, 110, 112 being on the board 120 of the electronic apparatus 100. For example, as shown in FIG. 2 and FIG. 4, the cooling liquid 11, when forced upward from the inflow opening 16bb, goes up toward the liquid level 19 while taking away heat from the surfaces of heat radiation members 114 thermally connected to the CPU and the GPU mounted on the three processor boards 112, 110, 112 as well as of the peripheral electronic components (not shown) and further, moves toward the outflow openings 17bb, 17bc, 17cb, 17cc. In this case, each volume of the storage sections 15aa to 15dd is small to be about 1/16 of the volume of the open space 10a of the cooling tank 12, and the electronic apparatus 100 stored therein is also small to be about 1/4 wide of the width of the cooling tank 12. Thus, the cooling efficiency of the electronic apparatus 100 is very excellent, and the cooling fluid 11 can effectively be prevented from remaining around the electronic apparatus 100.

The cooling liquids having been warmed by taking heat from the electronic apparatuses 100 pass through the outflow openings 17aa to 17ee residing in the vicinity of the liquid level 19 in the cooling tank 12, go down in the outflow pipes 170, pass through the bottom openings 18aa to 18ee and gather at the outlet 18 through the collection pipe (not shown). At this time, since one or more small holes 171 are formed in the longitudinal direction of each outflow pipe 170, the cooling liquid 11 flows inside the outflow pipe 170 through the small holes 171. Accordingly, the cooling liquid 11 being at a mid portion in the depth direction of each storage section is accelerated to flow, and thus, the cooling liquid 11 well spreads over the whole of the board 120 of the electronic apparatus 100. Therefore, it becomes possible to cool the peripheral electronic components (not shown) at higher efficiency. Incidentally, in the illustrated example, each outflow pipe 170 is formed with six small holes 171 at fixed intervals. However, this is one example, and a person ordinarily skilled in the art may discretionally determine the number and positions of the small holes.

In the cooling system 10 of the present embodiment, the temperatures of the respective storage sections may be monitored at all times by a controller (not shown), and other flow regulating valves (not shown) may be provided in respective distribution pipes (not shown) extending from the inlet 16 to the inflow openings 16aa to 16dd, the flow regulating valves being for regulating the flow volumes of the cooing liquids passing through the inflow openings 16aa to 16dd of the respective storage sections 15aa to 15dd in response to input signals that the controller transmits in dependence on the temperature variations in the respective storage sections. Where the configuration is taken like this, by individually regulating the flow volumes of cooling liquids passing through the respective storage sections, it becomes possible to individually control the intensities in cooling the electronic apparatuses by the cooling liquids, and hence, it is possible to control the performances in cooling the plurality of electronic apparatuses more accurately.

In the cooling system 10 of the present embodiment, the respective storages sections 15aa to 15dd may be provided therein with first temperature sensors (not shown) for liquid, and there may be further provided a mechanism (not shown) that, when a predetermined temperature or higher is detected by the first temperature sensor, discontinues the operation of the electronic apparatus 100 stored in the storage section of which such a high temperature is detected, or interrupts the power supply to the electronic apparatus 100. By the provision of such a fail-safe mechanism, the cooling liquid 11 flowing through each storage section can be prevented from rising to an unusual temperature exceeding a set temperature, and hence, it can be realized to prevent the electronic apparatuses from being damaged and to prevent a harmful compound from being generated from fluorocarbon.

Further, in the cooling system 10 of the present embodiment, as another configuration of the fail-safe mechanism, a second temperature sensor (not shown) may be provided in the electronic apparatus 100 stored in each of the storage sections 15aa to 15dd or in a surrounding area of the electronic apparatus 100 stored in each of the storage sections 15aa to 15dd, and a mechanism (not shown) may be further provided that discontinues the operation of the electronic apparatus 100 or interrupts the power supply to the electronic apparatus 100 when a predetermined temperature or higher is detected by the second temperature sensor.

Although in the foregoing one embodiment, description has been made of the example wherein the inflow opening is formed at the bottom portion of each storage section. The inflow opening may be formed at a side surface of each storage section. Hereinafter, a cooling system according to another embodiment of the present invention will be described with reference to FIG. 6 and FIG. 7, and a cooling system according to still another embodiment of the present invention will be described with reference to FIG. 8.

Figure 6:
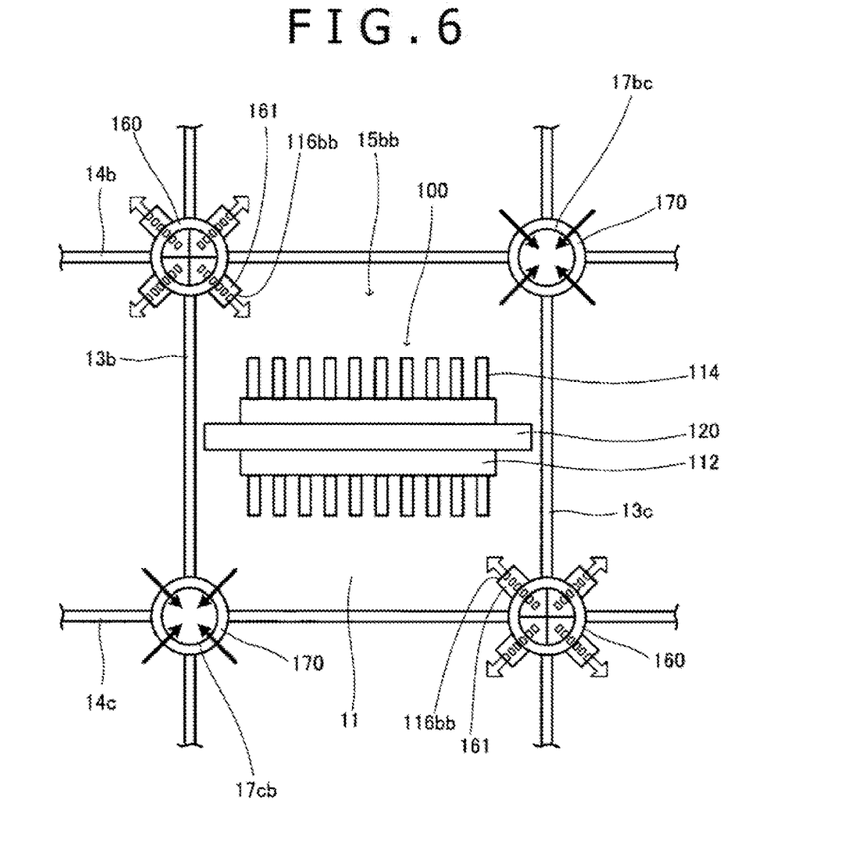
FIG. 6 is a plan view showing the structure of an important portion of a cooling system in another embodiment according to the present invention.
Figure 7:
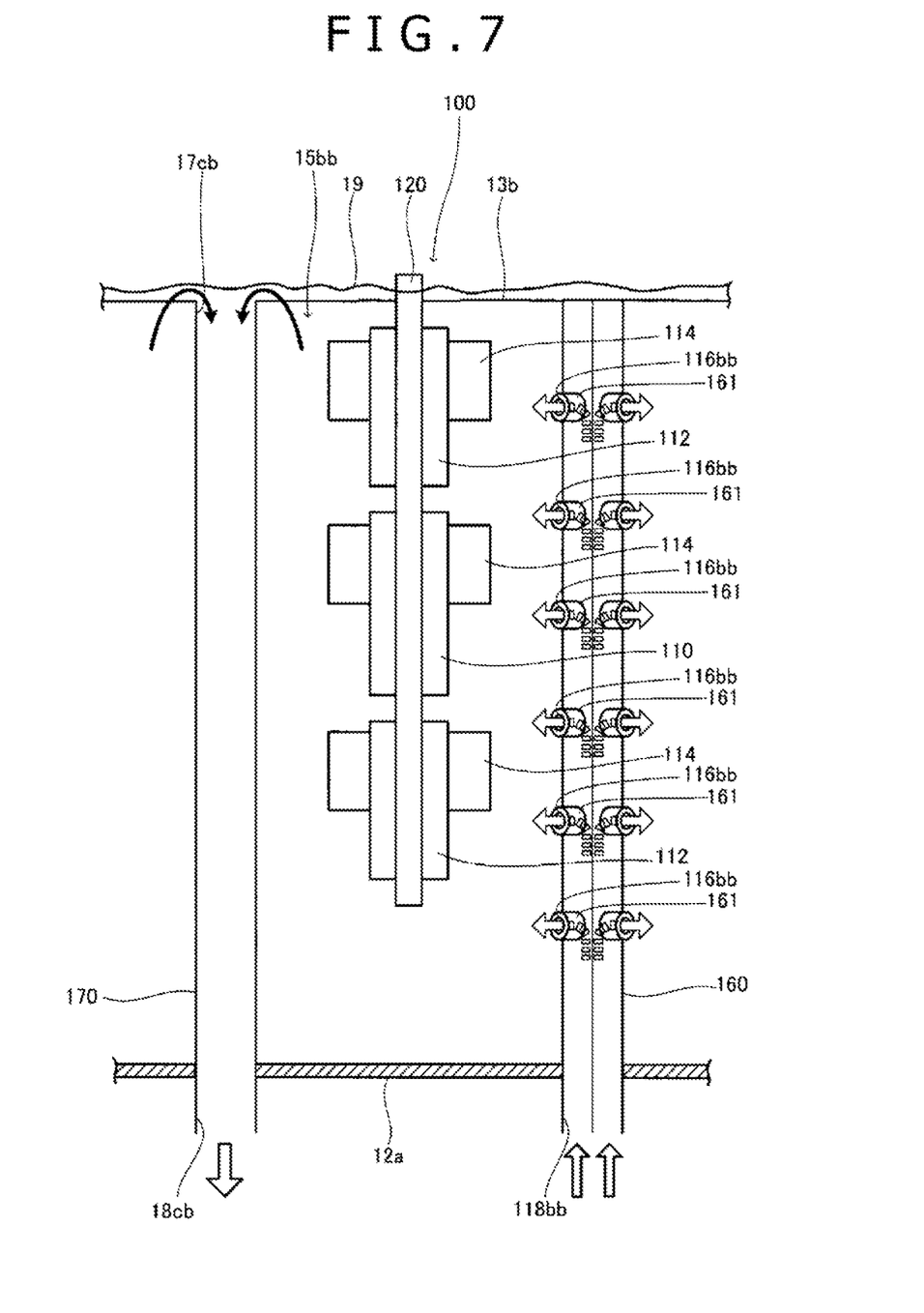
FIG. 7 is a longitudinal sectional view showing the structure of the important portion of the cooling system in another embodiment according to the present invention.

FIG. 6 and FIG. 7 are respectively a plan view and a longitudinal sectional view showing the configuration of an important portion of the cooling system according to another embodiment of the present invention. Instead of being formed at the bottom portion of each of the storage sections 15*aa* to 15*dd* of the cooling system 10, the inflow opening for the cooling liquid 11 is formed by inflow pipes 160 that are provided at side surfaces of each of the storage sections 15*aa* to 15*dd*. That is, the cooling system 10 is further provided with the inflow pipes 160 that pierce through the bottom wall 12*a* to extend to the vicinity of the liquid level 19. The inflow pipes 160 each have a plurality of nozzles 161 in the longitudinal direction of the inflow pipes 160, and the plurality of nozzles 161 are formed with inflow openings 116*aa*, 116*ab*, 116*ac*, 116*ad*, 116*ae*, 116*ba*, 116*bb*, 116*bc*, 116*bd*, 116*be*, 116*ca*, 116*cb*, 116*cc*, 116*cd*, 116*ce*, 116*da*, 116*db*, 116*dc*, 116*dd*, 116*de*, 116*ea*, 116*eb*, 116*ec*, 116*ed*, 116*ee* (hereafter, occasionally referred to as "outflow openings 116*aa* to 116*ee*" collectively).

In the present embodiment, the inflow pipes 160 and the outflow pipes 170 may be alternately arranged at the positions where the plurality of inner partitioning walls defining each of the respective storage sections 15*aa* to 15*dd* intersect with one another, or in the vicinity of the positions. Therefore, referring to FIG. 6 for example, the storage section 15*bb* is defined by the inner partitioning walls 13*b*, 13*c* in the length direction and the inner partitioning walls 14*b*, 14*c* in the width direction, and the outflow pipes 170 are arranged respectively at a point where the inner partitioning wall 13*b* intersects with the inner partitioning wall 14*c* and a point where the inner partitioning wall 13*c* intersects with the inner partitioning wall 14*b*. It is the same as those in FIG. 3 that the outflow openings 17*cb*, 17*bc* are respectively formed at the upper ends of the outflow pipes 170. On the other hand, the inflow pipes 160 are arranged respectively at a point where the inner partitioning wall 13*b* intersects with the inner partitioning wall 14*b* and a point where the inner partitioning wall 13*c* intersects with the inner partitioning wall 14*c*. The inflow pipe 160 has the plurality of nozzles 161 in the longitudinal direction, and the plurality of nozzles are respectively formed with inflow openings 116*bb*. Incidentally, the inflow pipe and the outflow pipe are not required to be integrated with the inner partitioning walls and may be pipes arranged apart from the inner partitioning walls.

Referring to FIG. 6, each inflow pipe 160 takes a structure that the interior is divided into four divisions, and is configured to make the cooling liquid 11 flowing through one division of the four divisions spout out into the storage section 15*bb* through inflow openings 116*bb* formed respectively in the plurality of nozzles 161. Accordingly, in the present embodiment, pairs of the inflow openings are formed diagonally at the side surfaces of each storage section. Further, since the inflow pipe 160 takes the structure that the interior is divided into four divisions, it is also possible to individually control the flow rates of cooling liquids flowing in the respective divisions. That is, the temperatures of the respective divisions may be monitored at all times by a controller (not shown), and another flow regulating valve (not shown) may be provided for each division at a suitable position on a path from a bottom opening referred to later to the inflow opening, the flow regulating valve being for regulating the flow rate passing through the inflow openings of the plurality of nozzles 161 upon receipt of an input signal that is transmitted from the controller in dependence on the temperature variation within the storage section. Thus, it is possible individually for each storage section to control the flow rates of the cooling liquids from the paired inflow openings being in the orthogonal direction. Incidentally, the inflow pipes 160 are formed at lower ends with bottom openings 118*aa*, 118*ab*, 118*ac*, 118*ad*, 118*ae*, 118*ba*, 118*bb*, 118*bc*, 118*bd*, 118*be*, 118*ca*, 118*cb*, 118*cc*, 118*cd*, 118*ce*, 118*da*, 118*db*, 118*dc*, 118*dd*, 118*de*, 118*ea*, 118*eb*, 118*ec*, 118*ed*, 118*ee* (hereafter, occasionally referred to as "bottom openings 118*aa* to 118*ee*" collectively). Each of the bottom openings 118*aa* to 118*ee* may be divided into four divisions respectively corresponding to the four division of the interior of each inflow pipe 160. Further, the upper end of each inflow pipe 160 is completely closed.

In the present embodiment, as shown in FIG. 6 and FIG. 7, it is preferable to form the upper end of the outflow pipes 170 with outflow openings 17*bc*, 17*cb* without forming the outflow pipes 170 with the small holes. Incidentally, that these outflow openings become the outflow openings common to the plurality of storage sections is the same as the outflow openings in the embodiment shown in FIG. 2 to FIG. 4.

In the present embodiment, the cooling efficiency can be further improved because the electronic apparatus 100 can be forcedly cooled by the plural flows of the cooling liquid 11 going from the plurality of the inflow openings 116*bb* toward the three processor boards 112, 110, 112 mounted on each side of the board 120, the inflow openings 116*bb* being formed as pairs in the orthogonal direction at the side surfaces of the storage section 15*bb* and being in the depth direction. The positions and number of the inflow pipes and the outflow pipes provided in each storage section are discretionary, and the inflow pipe and the outflow pipe may, of course, each be provided to be one or plural in the vicinity of the positions where the plural inner partitioning walls defining each storage section intersect with one another.

Next, a cooling system according to still another embodiment will be described with reference to FIG. 8. In this embodiment, the configuration having the inflow pipes 160 piercing through the bottom wall 12*a* and extending to the vicinity of the liquid level 19 is the same as the configuration of the embodiment shown in FIG. 6 and FIG. 7. However, a feature resides in that the inflow pipe 160 and the outflow pipe 170 are configured as a double pipe 180 containing the outflow pipe 170 in the inflow pipe 160, in other words, in that the double pipe 180 is configured having the outflow pipe 170 as an inner pipe and the inflow pipe 160 as an outer pipe. Incidentally, it is the same as the configurations in the embodiment shown in FIG. 6 and FIG. 7 that the plurality of nozzles 161 are provided on the inflow pipe 160 in the longitudinal direction of the inflow pips 160 and are formed respectively with the inflow openings 116*aa* to 116*ee*, that the upper end of the inflow pipe 160 is completely closed, and that the inflow pipe 160 takes the configuration of the interior divided into four divisions wherein the cooling liquid 11 flowing along one of the four divisions is enabled to pass through the inflow openings 116*aa* to 116*ee* formed respectively on the plurality of nozzles 161 and then to spout out into the storage sections 15*aa* to 15*dd*.

In the present embodiment, the double pipe 180 may be arranged at the position where the plural inner partitioning walls defining the respective storage sections 15*aa* to 15*dd* intersect with one another, or in the vicinity of the position. That is, the double pipes 180 may be arranged to reside respectively at the intersection point of the inner partitioning wall 13b and the inner partitioning wall 14b, at the intersection point of the inner partitioning wall 13b and the inner partitioning wall 14c, at the intersection point of the inner partitioning wall 13c and the inner partitioning wall 14b and at the intersection point of the inner partitioning wall 13c and the inner partitioning wall 14c. Incidentally, the double pipe is not required to be integrated with the inner partitioning walls and may be the pipe which is arranged apart from the inner partitioning walls.

Accordingly, in the present embodiment, the inflow openings are formed at the four corners of the side surfaces of each storage section. Further, since the inflow pipe 160 is configured to have the interior divided into four divisions, it is also possible to individually control the flow rates of the cooling liquids flowing along the respective divisions. That is, the temperatures of the respective storage sections may be monitored at all times by a controller (not shown), and other flow regulating valves (not shown) may be provided for the respective divisions at suitable positions on the path from the bottom opening to the inflow opening, the other flow regulating valves being for regulating the flow rates of the cooling liquids passing through the inflow openings of the plurality of nozzles 161 upon receipt of an input signal that is transmitted from the controller in dependence on the temperature variation within the storage section. Thus, the flow rates of the cooling liquids from the inflow openings at the four corners on the side surfaces of each storage section can be controlled individually for each storage section. Incidentally, the lower ends of the inflow pipes 160 being the outer pipes of the double pipes 180 are formed with the bottom openings 118aa to 118ee. Each of the bottom openings 118aa to 118ee may be divided into four to correspond respectively to the four sections in the interior of the inflow pipe 160. Further, the upper end of the inflow pipe 160 being the outer pipe of the double pipe 180 is closed completely. Incidentally, the lower ends of the outflow pipes 170 are formed with the bottom openings 18aa to 18ee. That the outflow opening formed at the upper end of the inflow pipe 170 being the inner pipe of the double pipe 180 becomes the outflow opening common to the plurality of storage sections is the same as the outflow opening in the embodiment shown in FIG. 6 and FIG. 7.

In the present embodiment, the cooling efficiency can be further improved because the electronic apparatus 100 can be forcedly cooled by the plural flows of the cooling liquids 11 going from the plurality of the inflow openings 116bb, which are formed at the four corners of the side surfaces of the storage section 15bb to be in the depth direction, toward the three processor boards 112, 110, 112 mounted on each side of the board 120. Incidentally, the positions and number of the double pipes provided in each storage section are discretionary, and one or plural double pipes may, of course, be provided in the vicinity of the positions where the plurality of inner partitioning walls defining each storage section intersect with one another.

Figure 8:
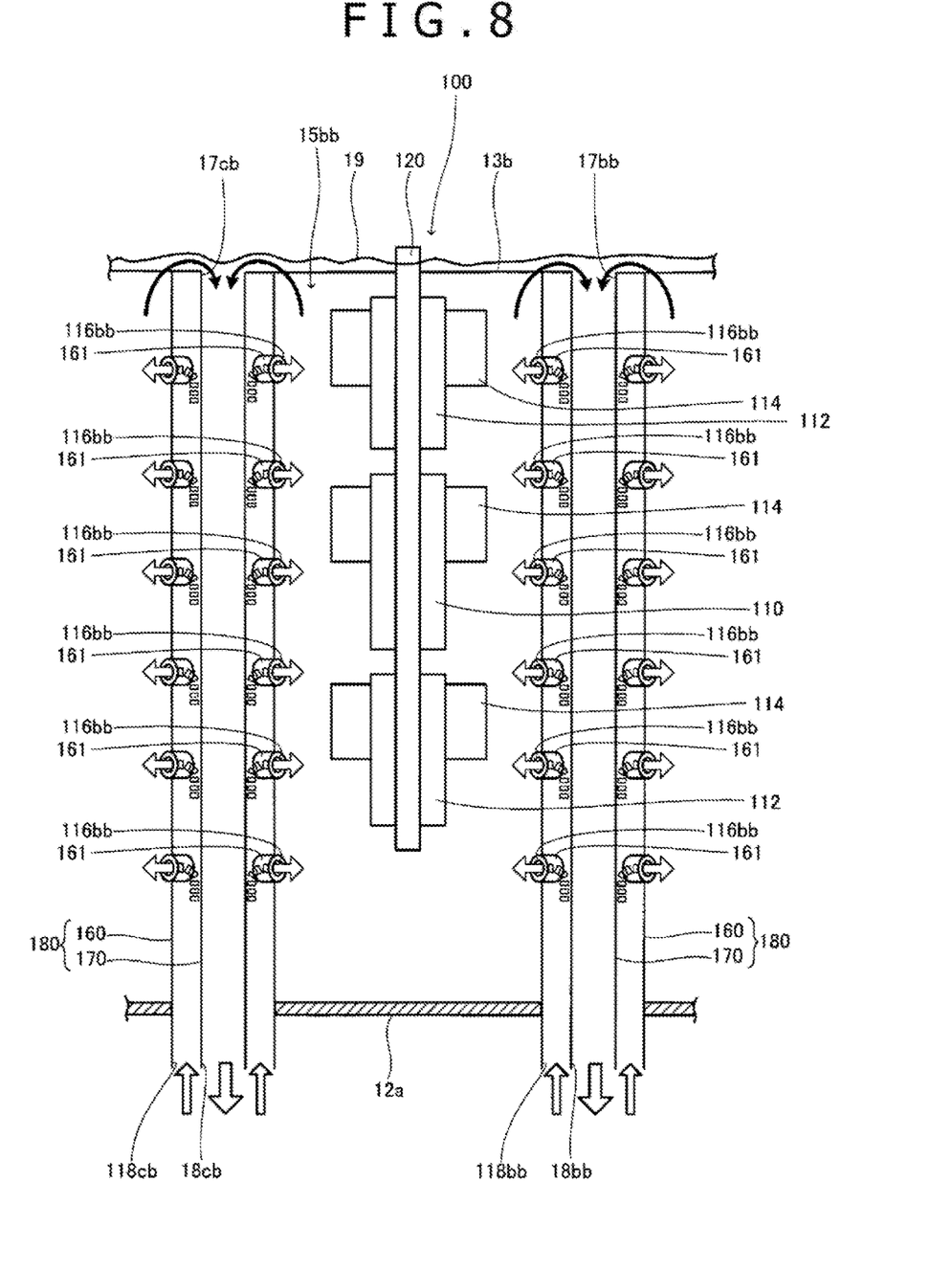
FIG. 8 is a longitudinal sectional view showing the structure of an important portion of a cooling system in still another embodiment according to the present invention.

In the foregoing embodiment shown in FIGS. 6 and 7 and the foregoing embodiment shown in FIG. 8, as examples of the inflow openings formed on the side surfaces of each storage section, description has been made regarding the example of pairs formed in the orthogonal direction of each storage section and the example of those formed at the four corners of each storage section. Further, in order to form the inflow openings on the side surfaces of each storage section, configurations are taken to utilize the inflow pipe having the plurality of nozzles formed with the inflow openings and to arrange the inflow pipe at the position where the plurality of inner partitioning walls defining each storage section intersect with one another, or in the vicinity of the position. However, these do not constitute limitations in the configuration that the inflow openings are formed on the side surfaces of each storage section. For example, as another example of the configuration, inner partitioning walls each taking a hollow structure may be used in place of arranging the inflow pipes, one or more slits may be formed on the wall surfaces of the inner partitioning walls to form inflow openings, and cooled cooling liquid may be made to flow in the inner partitioning walls and to spout out into the storage sections through the one or more slits. Further, as still another example of the configuration, branches which cooled cooling liquid passes through may be provided on a part or all of the surfaces of the inner partitioning walls, and the inflow openings may be formed at arbitrary positions of the branches by an arbitrary number, so that the cooling liquid may spout out into the storages section through these inflow openings.

Although in the foregoing one embodiment and other embodiments, illustration has been made regarding the example in which the processor 110, 112 are mounted on the board 120 of the electronic apparatus 100, either or both of the CPU and the GPU may be included in the processor. Further, there may be included a high speed memory, a chip set, a network unit, a PCI express bus, a bus switching unit, an SSD, and power units (ac-dc converter, dc-dc voltage converter and the like). Further, the electronic apparatus 100 may be an electronic apparatus like a storage device such as a server including a blade server, a router, an SSD or the like. However, as mentioned already, the electronic apparatus 100 may, of course, be an electronic apparatus of a smaller width (for example, about ½, ⅓ or ¼) than that of those conventional in the prior art.

In short, as described hereinabove, according to the cooling system of the present invention, the electronic devices being smaller in width than those in the prior art are stored in the storage sections of the volume being about ¼ or being smaller than about ¼ of the volume of the open space in the cooling tank, and the cooling liquid is made to pass through the individuals of the storage sections, whereby the plurality of electronic apparatuses can be individually cooled at high efficiency. Thus, it can be avoided that, as is true with the prior art, differences in cooling efficiency arise in dependence on the storage positions of electronic apparatuses within a cooling tank. Accordingly the performance in cooling of the plurality of electronic apparatuses can be improved and stabilized. Further, since it is possible to reduce the size of the electronic apparatuses stored in the storage sections, the capability of being handled and the maintainability of the electronic apparatuses can be improved.

INDUSTRIAL APPLICABILITY

The present invention is able to be widely applied to cooling systems for cooling electronic apparatuses efficiently.

REFERENCE SIGNS LIST

10: cooling system
10a: open space
100: electronic apparatus
110: processor board (with CPU mounted)
112: processor board (with GPU mounted)
114: heat radiation member 120: board
11: cooling liquid
12: cooling tank
12a: bottom wall
12b: side wall
13a, 13b, 13c, 13d, 13e: inner partitioning wall
14a, 14b, 14c, 14d, 14e: inner partitioning wall
15aa, 15ab, 15ac, 15ad, 15ba, 15bb, 15bc, 15bd, 15ca, 15cb, 15cc, 15cd, 15da, 15db, 15dc, 15dd: storage section
16: inlet
16aa, 16ab, 16ac, 16ad, 16ba, 16bb, 16bc, 16bd, 16ca, 16cb, 16cc, 16cd, 16da, 16db, 16dc, 16dd: inflow opening
116aa, 116ab, 116ac, 116ad, 116ae, 116ba, 116bb, 116bc, 116bd, 116be, 116ca, 116cb, 116cc, 116cd, 116ce, 116da, 116db, 116dc, 116dd, 116de, 116ea, 116eb, 116ec, 116ed, 116ee: inflow opening
160: inflow pipe
161: nozzle
17aa, 17ab, 17ac, 17ad, 17ae, 17ba, 17bb, 17bc, 17bd, 17be, 17ca, 17cb, 17cc, 17cd, 17ce, 17da, 17db, 17dc, 17dd, 17de, 17ea, 17eb, 17ec, 17ed, 17ee: outflow opening
170: outflow pipe
171: small hole
18: outlet
180: double pipe
18aa, 18ab, 18ac, 18ad, 18ae, 18ba, 18bb, 18bc, 18bd, 18be, 18ca, 18cb, 18cc, 18cd, 18ce, 18da, 18db, 18dc, 18dd, 18de, 18ea, 18eb, 18ec, 18ed, 18ee: bottom opening
118aa, 118ab, 118ac, 118ad, 118ae, 118ba, 118bb, 118bc, 118bd, 118be, 118ca, 118cb, 118cc, 118cd, 118ce, 118da, 118db, 118dc, 118dd, 118de, 118ea, 118eb, 118ec, 118ed, 118ee: bottom opening
19: liquid level
30: flow passage
40: pump
50: flow rate regulating valve
70: flowmeter
90: heat exchanger

The invention claimed is:

1. A cooling system for directly cooling a plurality of electronic apparatuses through immersion into cooling liquid, the cooling system comprising:
a cooling tank having an open space defined by a bottom wall and side walls;
a plurality of storage sections defined by a plurality of inner partitioning walls provided within the cooling tank to divide the open space, the storage sections being for storing at least one electronic apparatus in each of the storage sections, the plurality of storage sections arranged in a two-dimensional array; and
an inflow opening and an outflow opening for the cooling liquid that are formed at each of the of storage sections;
wherein the inflow opening is formed at a bottom portion or a side surface of each of the storage sections and wherein the outflow opening is formed in a vicinity of the liquid level of the cooling liquid flowing through each of the storage sections, and
the outflow opening and/or the inflow opening is formed at a position where the plurality of inner partitioning walls defining each storage section intersect with one another.

2. The cooling system according to claim 1, further comprising an outflow pipe piercing through the bottom wall and extending to the vicinity of the liquid level, wherein the outflow opening is formed at one end of the outflow pipe.

3. The cooling system according to claim 2, wherein one or more small holes are formed in a longitudinal direction of the outflow pipe.

4. The cooling system according to claim 1, further comprising an inflow pipe piercing through the bottom wall and extending to the vicinity of the liquid level,
wherein the inflow pipe has a plurality of nozzles in a longitudinal direction of the inflow pipe and wherein the inflow opening is formed on each of the plurality of nozzles.

5. The cooling system according to claim 4, wherein the inflow opening includes a plurality of inflow openings,
the outflow opening includes a plurality of outflow openings,
the cooling tank has an inlet for distributing the cooling liquid toward the inflow openings of respective ones of the storage sections, and
an outlet for collecting the cooling liquid passing through the outflow openings of the respective ones of the storage sections; and wherein:
the outlet and the inlet are connected through a flow passage existing outside the cooling tank; and
at least one pump for moving the cooling liquid and a heat exchanger for cooling the cooling liquid are provided in the flow passage.

6. The cooling system according to claim 5, further comprising a mechanism which, in response to an input signal depending on the temperature variation in each of the storage sections, regulates a flow rate of the cooling liquid passing through the inflow opening of each of the storage sections or a flow rate of the cooling liquid passing through each of the nozzles provided on the inflow pipe.

7. The cooling system according to claim 1, further comprising an inflow pipe and an outflow pipe that pierce through the bottom wall and that extend to the vicinity of the liquid level;
wherein:
the inflow pipe is provided with a plurality of nozzles in a longitudinal direction of the inflow pipe, and the inflow opening is formed on each of the plurality of nozzles;
the outflow opening is formed at an upper end of the output pipe; and
the inflow pipe and the outflow pipe are alternately arranged at positions where the plurality of inner partitioning walls defining each of the storage sections intersect with one another.

8. The cooling system according to claim 1, further comprising an inflow pipe and an output pipe that pierce through the bottom wall and that extend to the vicinity of the liquid level; wherein:
the inflow pipe is provided with a plurality of nozzles in a longitudinal direction of the inflow pipe, and the inflow opening is formed on each of the plurality of nozzles;
the outflow opening is formed at an upper end of the outflow pipe; and
the inflow pipe and the outflow pipe constitute a double pipe containing the outflow pipe in the inflow pipe.

9. The cooling system according to claim 8, wherein the double pipe is arranged at a position where the plurality of inner partitioning walls defining each of the storage sections intersect with one another.

10. The cooling system according to claim 1, wherein the cooling liquid contains perfluoride as a main component.

11. The cooling system according to claim 1, wherein the inflow opening includes a plurality of inflow openings, the outflow opening includes a plurality of outflow openings, the cooling tank has an inlet for distributing the cooling liquid toward the inflow openings of respective ones of the storage sections, and an outlet for collecting the cooling liquid passing through the outflow openings of the respective ones of the storage sections; and wherein:

the outlet and the inlet are connected through a flow passage existing outside the cooling tank; and at least one pump for moving the cooling liquid and a heat exchanger for cooling the cooling liquid are provided in the flow passage.

12. The cooling system according to claim 1, further comprising a temperature sensor for the cooling liquid provided in each of the storage sections and a mechanism which discontinues an operation of a corresponding one of the electronic apparatuses stored in the respective ones of the storage sections or interrupts the power supply to the electronic apparatus when a predetermined temperature or higher is detected by the temperature sensor.

13. The cooling system according to claim 1, further comprising a temperature sensor provided in each of the electronic apparatuses stored in the respective one of the storage sections, or in a surrounding area of each of the electronic apparatuses stored in the respective one of the storage sections and a mechanism which discontinues an operation of a corresponding one of the electronic apparatuses or interrupts a power supply to the corresponding one of the electronic apparatuses when a predetermined temperature or higher is detected by the temperature sensor.

* * * * *